United States Patent
Chandrashekar et al.

(10) Patent No.: US 9,013,213 B2
(45) Date of Patent: Apr. 21, 2015

(54) DIGITAL FRACTIONAL FREQUENCY DIVIDER

(75) Inventors: Kailash Chandrashekar, Portland, OR (US); Stefano Pellerano, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,191

(22) PCT Filed: Oct. 1, 2011

(86) PCT No.: PCT/US2011/054480
§ 371 (c)(1),
(2), (4) Date: Mar. 14, 2014

(87) PCT Pub. No.: WO2013/048525
PCT Pub. Date: Apr. 4, 2013

(65) Prior Publication Data
US 2014/0185736 A1    Jul. 3, 2014

(51) Int. Cl.
*H03B 19/00* (2006.01)
*H03K 21/02* (2006.01)
*H03K 23/54* (2006.01)

(52) U.S. Cl.
CPC ............ *H03K 21/023* (2013.01); *H03K 21/026* (2013.01); *H03K 23/542* (2013.01)

(58) Field of Classification Search
USPC ......... 327/115, 116, 117, 118, 355–361, 202, 327/203, 208–212, 218, 141, 144–163; 377/47, 48, 49; 455/4; 331/1/A, 15–17; 375/373–376
See application file for complete search history.

(56) References Cited

U.S. PATENT DOCUMENTS

| | | | |
|---|---|---|---|
| 5,767,705 A | 6/1998 | Ichinoi et al. | |
| 5,940,467 A * | 8/1999 | Fransson | 377/49 |
| 6,509,800 B2 * | 1/2003 | Stockton | 331/11 |
| 6,566,918 B1 * | 5/2003 | Nguyen | 327/115 |
| 6,807,552 B2 | 10/2004 | Bredin et al. | |
| 7,493,510 B2 * | 2/2009 | Sung et al. | 713/503 |

(Continued)

FOREIGN PATENT DOCUMENTS

WO        2013/048525 A1    4/2013

OTHER PUBLICATIONS

International Search Report and Written Opinion received for PCT application No. PCT/US2011/054480, mailed on May 30, 2012, 13 pages.

(Continued)

*Primary Examiner* — Brandon S Cole
(74) *Attorney, Agent, or Firm* — Thorpe North & Western LLP (57) ABSTRACT

A digital fractional frequency divider for fractionally dividing a digital frequency signal can include a plurality of clock division counter modules, a plurality of sampling modules, and a summing module. The plurality of clock division counter modules can each receive an input clock signal that is phase-shifted from a remaining plurality of input clock signals. Each clock division counter module can generate a long periodic pulse from the received input clock signal. Each sampling module can couple to an output of one of the plurality of clock division counter modules and can generate a short periodic pulse from the long periodic pulse. The summing module can sum the plurality of short periodic pulses to generate a fractional frequency clock signal.

16 Claims, 9 Drawing Sheets

(56) References Cited

U.S. PATENT DOCUMENTS

| | | | |
|---|---|---|---|
| 7,756,487 | B2* | 7/2010 | Lerner et al. ............ 455/76 |
| 8,432,193 | B2* | 4/2013 | Marutani ............ 327/117 |
| 2005/0216780 | A1* | 9/2005 | Sung et al. ............ 713/500 |
| 2005/0258879 | A1 | 11/2005 | Marutani |
| 2005/0281367 | A1* | 12/2005 | Lesso ............ 375/376 |
| 2006/0220697 | A1 | 10/2006 | Flynn |
| 2011/0311018 | A1* | 12/2011 | Chen et al. ............ 377/47 |
| 2013/0328600 | A1* | 12/2013 | Woelk et al. ............ 327/118 |

OTHER PUBLICATIONS

International Preliminary Report on Patentability and Written Opinion received for PCT Patent Application No. PCT/US2011/054480, mailed on Apr. 10, 2014, 9 pages.

Degani, et al., "A 1×2 MIMO Multi-Band CMOS Transceiver with an Integrated Front-End in 90 nm CMOS for 802.11a/g/n WLAN Applications", Proc. IEEE ISSCC Dig. Tech. Papers, Feb. 2008, pp. 356-357.

Pellerano, et al., "A 4.75-GHz Fractional Frequency Divider-by-1.25 With TDC-Based All-Digital Spur Calibration in 45-nm CMOS", IEEE J. Solid-State Circuits, vol. 44, No. 12, Dec. 2009, pp. 3422-3433.

Sadhwani, et al., "Multi-band Multi-standard Local Oscillator Generation for Direct up/down Conversion Transceiver Architectures Supporting WiFi and WiMax Bands in Standard 45nm CMOS Process", Radio Frequency Integrated Circuits Symposium (RFIC), May 2010, pp. 149-152.

* cited by examiner

DIGITAL FRACTIONAL FREQUENCY DIVIDER

BACKGROUND

Many electronic devices operate off a periodic clock signal to synchronize the transmission of data between electronic components within the device. Periodic clock signals can be provided by an oscillator, such as voltage controlled oscillator (VCO). Periodic clock signals are also used in radio devices and wireless devices to generate specified frequencies that can be used for a variety of purposes including upconversion, downconversion, and transmission on a carrier frequency. A wireless communication device may be allocated a specified range of frequency bands in which data is transmitted. A fractional frequency divider can be used to generate various frequency bands.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Fractional division of local-oscillator (LO) signals can be achieved by dividing the signal by different integers and combining the resulting signals with mixers or adders. An LO and a voltage-controlled oscillator (VCO) can be manufactured on semiconductor wafers using processes like a complementary metal-oxide-semiconductor (CMOS) process and cut into dies, which can be packaged into chips. LOs and fractional dividers can have analog and digital components.

LO signals with high spectral purity can be generated by expensive filters containing inductors. Integrating inductors into a die can increase the total die cost because the inductors (and filters containing inductors) can occupy a large area of the semiconductor die. An analog component refers to a component, such as an inductor, that receives or generates a continuously variable electrical signal. In contrast, a digital component refers to a component that receives or generates signals by discrete bands of analog levels (which can be interpreted as a digital one or a digital zero), rather than by a continuous range. Digital signal levels within a discrete band represent the same signal state within a specified tolerance. Since an all-digital fractional divider does not include analog components, such as inductors, an all-digital fractional divider can reduce the die or chip size.

In one example, an all-digital fractional divider can be implemented with calibrated phase rotators (or digital phase rotator [DPR]), which can achieve fractional division with high spectral purity. Phase rotators can include a multiplexer (or MUX) that switches between multiple phases of the input signal to generate an output signal at a fractional frequency. A multiplexer can be a device that selects one of several analog or digital input signals and forwards the selected input into a single line. The MUX control signals can be generated by a high-speed shift register, like a Johnson counter, that can be clocked by the output signal.

In order to avoid glitches (i.e., signal spurs) in the output, the MUX can switch between the input phases when the input phases are at a substantially similar voltage level (i.e., both phases are high or low). Requiring input phases to switch at the substantially similar voltage level can place a tight constraint on the timing requirements of the MUX control signals, such as the setup and hold time, which can limit the LO signal to a narrow range of frequencies and/or can make the divider sensitive to process, voltage and temperature (PVT) variation.

A high-speed digital fractional divider architecture can provide reconfigurable multiple fractional division ratios, eliminate the need for precise timing of MUX control signals thereby expanding the frequency of operation of the divider, and provide a divider that can be more robust to PVT variations (minimize the sensitivity to PVT variations) and transistor model inaccuracies. For example, the fractional divider can operate on individual phases in parallel, perform an integer division on each phase, and sum the resulting signals to obtain the desired fractional frequency at the output. The digital fractional frequency divider can provide a radio frequency (RF) fractional frequency divider that can operate over a wide frequency range, can be robust to PVT variations, and can provide multiple fractional division ratios. The digital fractional frequency divider can provide a periodic clock signal to synchronize the transmission of data between electronic components and devices.

Figure 1A:
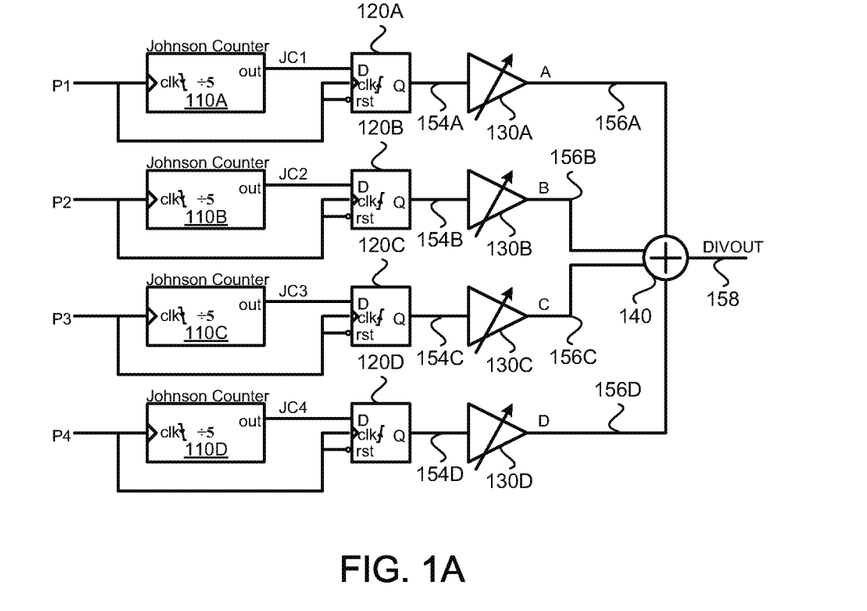
FIG. 1A illustrates a block diagram of a four phase divide by 1.25 digital fractional frequency divider in accordance with an example.

FIG. 1A illustrates one example of a 4-phase divider with a divide by five Johnson counter. The 4 phases are first divided by 5 and then combined, which is equivalent to a division by 5 and a multiplication by 4, leading to an overall division ratio of 5/4 (or a 1.25 fractional frequency divider).

The fractional frequency divider can use a multi-phase input to perform fractional division. FIG. 1A illustrates a 4-phase input clock signal P1-P4. While a 4-phase input clock is shown in this example, it is not intended to be limiting. A different number of phases may also be used. A phase generation module (not shown) can generate input signal clock signals that are phase shifted from each other. The phase generation module can include a voltage-controlled oscillator (VCO), a local oscillator (LO), a delay-locked loop (DLL), a phase-locked loop (PLL), a quadrature VCO, a frequency divider, or a combination of the listed components.

Clock division modules (such as Johnson counters 110A-D) can each receive the input clock signal P1-P4 that is phase-shifted from other input clock signals. In one example, the input clock signal can be a square wave. In FIG. 1A, each input clock signal is phase-shifted 90° (or π/2) from the other input clock signals, where P1 is followed by P2, then P3, and then P4. The clock division counter module can include a Johnson counter 110A-D (shown in FIG. 1A), a twisted ring counter, a straight ring counter, an Overbeck counter, a Moebius counter, a shift register, or a combination of the listed components. The ring counter can be composed of a circular shift register configuration where the output of the last shift register is fed to the input of the first register. The ring counter can be initialized so that a single digital one (or digital zero) bit can rotate around the ring. Alternatively, the ring counter can be initialized so that a group of digital one (or digital zero) bits can rotate around the ring. The ring counter can include an integer divider, a cyclical counter, a shift register, flip-flops or latches, or a combination of these elements. Each clock division module can generate a long periodic pulse JC1-JC4 from the received input clock signal P1-P4, respectively. A pulse can be a high or low signal that can be interpreted as a digital one or a digital zero.

The clock division counter module can be reconfigurable to change the period (and the duty cycle) of the long pulse periodic JC1-JC4. The clock division counter module can include a plurality of latches where an output of each latch functioning in the clock division counter module couples to an input of a subsequent latch in a ring configuration. The clock division counter module can include at least one switching mechanism for allowing a first latch output to switch between a second latch input and a third latch input, where the second latch is between the first latch and the third latch.

An output of the clock division counter module for each phase may be coupled to an input of a sampling module (such as the delay flip-flops [D flip-flops] 120A-D) for that phase.

The sampling module can generate a short periodic pulse 154A-D from the long periodic pulse JC1-JC4. The short periodic pulse can have a substantially similar period as the long periodic pulse. The short periodic pulse from each phase can be non-overlapping periodic pulses with other short periodic pulses of the other phases.

The sampling module coupled to the clock division counter module can include a flip-flop, latch, or other circuit for storing state information. The flip-flop or latch is a circuit that has two stable states and can be used to store state information. The flip-flop or latch can be made to change state by signals applied to one or more control inputs and can have at least one output. FIG. 1A illustrates one example of the sampling modules using D flip-flops 120A-D where the clock input and control signal (reset) for each phase are provided by the input clock signal P1-P4 for the phase.

At least one tunable delay module 130A-D may be coupled to an output of the sampling module 120A-D. Each tunable delay module can provide fine adjustment of the short periodic pulse 154A-D and align a phase of the short periodic pulse to a desired phase 156A-D. The tunable delay module can include a time-to-digital converter (TDC).

The short periodic pulse 154A-D output by each sampling module 120A-D (or the output 156A-D of each tunable delay module 130A-D) may provide an input signal to a summing module 140. The summing module can sum or add the short periodic pulses for each phase to generate a fractional frequency clock signal DIVOUT 158. The summing module can include a digital gate, such as an OR, AND, NAND, or NOR gate.

Referring back to the example of the Johnson counter 110A-D of FIG. 1A, each phase of the digital fractional frequency divider can be divided by 5 using the Johnson counter, where one latch (one bit) within the Johnson counter is initialized to "1" (digital high) and the other latches (other bits) are initialized to "0" (digital lows). This initialization provides that each Johnson counter's output JC1-JC4 (corresponding with 160A-D in FIG. 1B) is high once in every five input clock periods. The output of each Johnson counter is sampled 170A-D (FIG. 1B) by the input clock signal (on a different edge of the clock from the latching of the long periodic pulse JC1-JC4) for the respective (or synchronous) phase, thereby producing a short periodic pulse once every 5 clock periods, as shown by signals A-D in FIG. 1B.

Figure 1B:
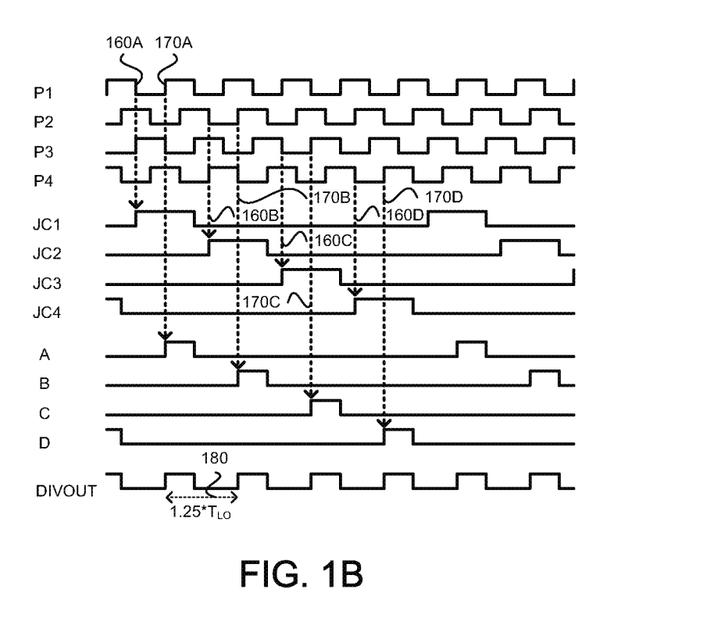
FIG. 1B illustrates a timing diagram for a four phase divide by 1.25 digital fractional frequency divider in accordance with an example.

By initializing the different counters appropriately, the short periodic pulses A-D can be spaced uniformly in time over 5 input clock periods. The time interval between the rising edge (or falling edge) of one pulse (either long or short periodic pulse) and the rising edge (or falling edge) of the next closest pulse will be the period of the fractional frequency clock signal DIVOUT, which is the sum of one input period ($T_{LO}$) and the time difference between two adjacent phases ($T_{LO}/4$ for four phases or $T_{LO}/ph$ where ph is a positive integer for the number of phases). Thus, when each short periodic pulse is combined using the summing module, a fractional frequency clock signal or an output signal (DIVOUT) is generated at a fractional frequency with respect to the input clock signal.

In FIG. 1A, the digital fractional frequency divider using four phase input clock signals P1-P4 with Johnson counters 110A-D configured for looping the inputs and outputs of five latches together (allowing for a pulse every five clock cycles) can generate an output signal with a $1.25*T_{LO}$ period 180 shown in FIG. 1B. The $1.25*T_{LO}$ period may have a duty cycle less than 50%, as the pulse of the output signal may have a pulse width substantially similar to the input clock signal pulse width. FIG. 1A illustrates a $1/(1.25*T_{LO})$ digital frequency generator or a divide by 1.25 digital fractional frequency divider. FIG. 1B illustrates a fractional frequency clock signal (or output signal) with a frequency less than the input clock signal (for one of the phases).

The fractional frequency clock signal 158 can have a frequency greater than or less than the input clock signal P1-P4. When the fractional frequency divider generates a frequency greater than the frequency of one of the phase input clock signals, the duty cycle of the fractional frequency clock signal (or output signal) may be greater than fifty percent (50%). When the fractional frequency divider generates a frequency less than the frequency of one of the phase input clock signals, the duty cycle of the fractional frequency clock signal (or output signal) may be less than fifty percent (50%). The duty cycle of a signal is the time that the signal spends in an active state as a fraction of the total period, if the signal is periodic. The period can be a categorization or a division of time into blocks with relatively periodic or repeating characteristics. The ratio of the digital high (or digital low) to the total period of a square wave can be called the duty cycle. A true square wave can have a fifty percent (50%) duty cycle (equal high and low periods). The square wave can alternate regularly and substantially instantaneously between two levels (a digital one and a digital zero).

Figure 1C:
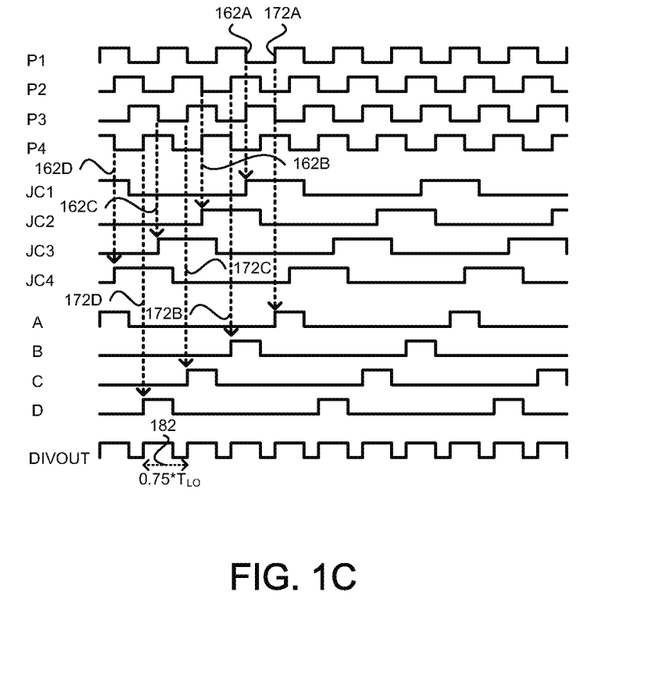
FIG. 1C illustrates a timing diagram for a four phase divide by 0.75 digital fractional frequency divider in accordance with an example.

In another example, each phase of the digital fractional frequency divider can be divided by 3 using a Johnson counter (not shown) with 3 latches in a ring, so each Johnson counter's output JC1-JC4 162A-D is high once in every three input clock periods using input clock signals P1-P4, where P4 is followed by P3, then P2, and then P1, as illustrated in FIG. 1C. The output of each Johnson counter is sampled 172A-D by the input clock signal for the synchronous phase producing a short periodic pulse A-D once every 3 clock periods. The digital fractional frequency divider using four phase input clock signals with Johnson counters configured for looping the inputs and outputs of three latches together (allowing for a pulse every three clock cycles) can generate an output signal with a $0.75*T_{LO}$ period 182. The $0.75*T_{LO}$ period may have a duty cycle greater than 50%, as the pulse of the output signal may have a pulse width substantially similar to the input clock signal pulse width. FIG. 1C illustrates the timing for a $1/(0.75*T_{LO})$ digital frequency generator or a divide by 0.75 digital fractional frequency divider. FIG. 1C illustrates a fractional frequency clock signal (or output signal) with a frequency greater than the input clock signal (for one of the phases).

Figure 1D:
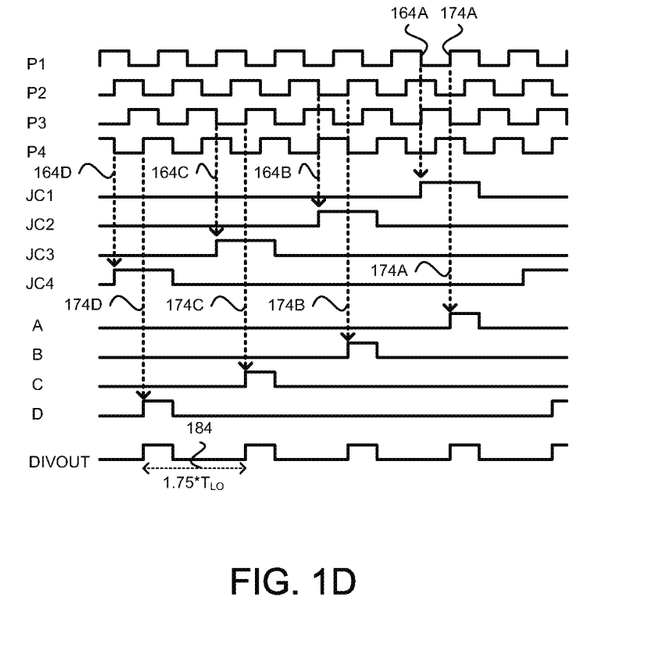
FIG. 1D illustrates a timing diagram for a four phase divide by 1.75 digital fractional frequency divider in accordance with an example.

In another example, each phase of the digital fractional frequency divider can be divided by 7 using a Johnson counter (not shown) with 7 latches in a ring, so each Johnson counter's output JC1-JC4 164A-D is high once in every seven input clock periods using input clock signals P1-P4, where P4 is followed by P3, then P2, and then P1, as illustrated in FIG. 1D. The output of each Johnson counter is sampled 174A-D by the input clock signal for the synchronous phase producing a short periodic pulse once every 7 clock periods. The digital fractional frequency divider using four phase input clock signals with Johnson counters configured for looping the inputs and outputs of three latches together (allowing for a pulse every three clock cycles) can generate an output signal with a $1.75*T_{LO}$ period 184. The $1.75*T_{LO}$ period may have a duty cycle less than 50%, as the pulse of the output signal may have a pulse width substantially similar to the input clock signal pulse width. FIG. 1D illustrates the timing for a $1/(1.75*T_{LO})$ digital frequency generator or a divide by 1.75 digital fractional frequency divider. FIG. 1D illustrates a fractional frequency clock signal (or output signal) with a frequency less than the input clock signal (for one of the phases).

The digital fractional frequency divider can generate a wide frequency range with high spectral purity. In one example, the digital fractional frequency divider can be configured to generate a clock frequency for the various channels within a band of an Institute of Electrical and Electronics Engineers (IEEE) 802.11 standard, an IEEE 802.16 standard, and/or a third generation partnership project (3GPP) long term evolution (LTE) standard. For example, the digital fractional frequency divider can generate a clock signal from a phase generation module, where the clock signal can have an output in a frequency band selected from the group consisting of 2.3 gigahertz (GHz) to 2.7 GHz, 3.3 GHz to 3.8 GHz, and 5.2 GHz to 5.8 GHz.

The initial condition of the clock division modules (Johnson counters in FIG. 1A) at start-up determines the spacing of the pulses in signals A-D with respect to each other. Once the clock division modules are initialized, the phases (four phases in FIG. 1A) operate on identical parallel paths that are independent of each other up to the input of the summing or adding module, thereby making the divider independent of the absolute delay of each path. The independent delay of each path can make the divider robust to PVT variations and model inaccuracies. The divider input/output frequency may be determined by the speed of the logic gates, and the spectral purity of the output may be determined by the delay matching between the four path delays.

Spectral purity can be a quantification of the variation of a frequency of a given electrical signal sample. Digital calibration provided by a tunable delay module can be used to overcome and correct a mismatch between the independent and parallel phase paths. For example, the tunable delay module can generate a replica of each phase in a redundant path and a delay of the replica path can then compared with the delay of the next phase with an appropriate delay offset added to the replica path. Other methods can also be used to correct the mismatch between the independent and parallel phase paths. The tunable delay module can suppress spurs by measuring timing errors between phases and then inserting adjustable digitally-controlled delay stages (or correction buffers) to correct the errors. Using a high resolution stochastic time-to-digital converter (TDC), a sub-pico second (sub-ps) measure of the mismatch between the phases can be obtained and corrected using at least one tunable delay module (or tunable delay cells). Another TDC can be used for a different mismatch resolution. The tunable delay module can use phase cloning with a reference phase of an input signal, which can be delayed by an adjustable time, for calibrating a phase of the digital fractional frequency divider. The digital calibration method has been shown to achieve fractional division with undesirable spurs more than 60 decibels less than the carrier (dBc). The dBc is the power ratio of a signal to a carrier signal, expressed in decibels. For example, phase noise can expressed in dBc/Hz at a given frequency offset from the carrier. The dBc can also be used as a measurement of spurious-free dynamic range (SFDR) between the desired signal and unwanted spurious outputs resulting from the use of signal converters, such as a digital-to-analog converter (DAC) or a frequency mixer. The digital fractional frequency divider can use the digital calibration method described using the tunable delay modules.

Figure 2:
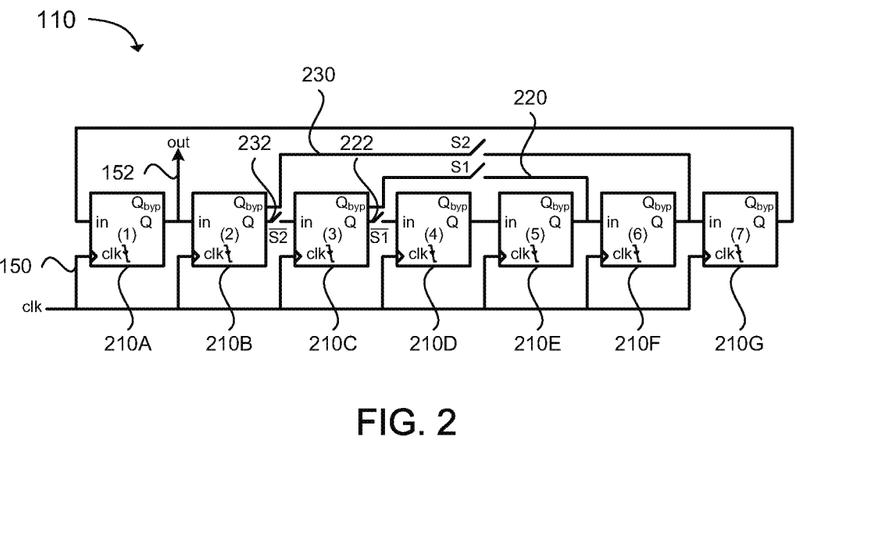
FIG. 2 illustrates a block diagram of a reconfigurable clock division counter module with seven latches in accordance with an example.

The clock division counter modules can be reconfigured to obtain different integer divisions, thereby, obtaining a reconfigurable fractional divider capable of dividing an input clock signal by different fractional numbers, as illustrated by the timing diagrams of FIGS. 1B-D. Reconfiguring the integer dividers can entail adding or bypassing latches, as illustrated by the Johnson counter 110 example in FIG. 2. The Johnson counter can be reconfigured for division by 3, 5 or 7. With S1 220 and S2 230 low or disconnected (and S1 bar 222 and S2 bar 232 high or connected), the Johnson counter has 7 latches 201A-G in a ring providing a division ratio of 7. $Q_{byp}$ and Q are shown as separate connection point for illustration, but $Q_{byp}$ and Q can be coupled to the same point on each latch. When S1 is high or connected (and S1 bar is low or disconnected) and S2 low or disconnected (and S2 bar high or connected), two latches 210D-E are bypassed with 5 latches 201A-C and 201F-G remaining in the ring providing an integer division ratio of 5. When S1 and S2 are high or connected (and S1 bar and S2 bar are low or disconnected), four latches 210C-F are bypassed with 5 latches 201A-B and 201G remaining in the ring for a division ratio of 3. The input clock signal for the phase can provide the clock signal 150 for each latch in the ring, and the long periodic pulse can be generated from an output 152 of a latch 201A in the ring. Matching timing between the different clock division counter modules of each phase may not be important since the output of the counter is eventually resynchronized with the input phase.

Figure 3A:
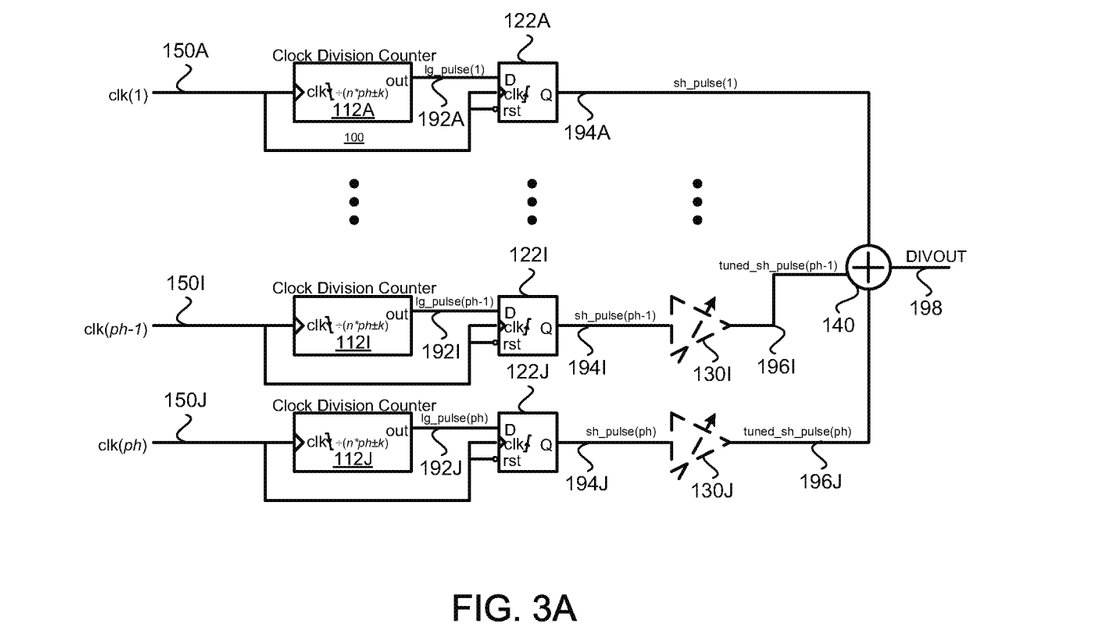
FIG. 3A illustrates a block diagram of a digital fractional frequency divider for a ph number of phases in accordance with an example.

In general, the fractional division ratios than can be obtained for a given number of input phases (ph) is described by: n±k/ph if k/ph<0.5 and where n and k are integers ≥1. FIG. 3A illustrates a digital fractional frequency divider with ph phases and divide by n±k/ph clock division counter modules 112A-J. In the example digital fractional frequency divider, each clock division module receives an input clock signal 150A-J phase-shifted from the other input clock signals. The phase-shift can be represented by 360°/ph (or 2π/ph). Each clock division module can generate a long periodic pulse lg_pulse(i) 192A-J from the respective received input clock signal, where i is a positive integer in the set 1 to ph(i ∈ {1, ..., ph−1, ph}). A long periodic pulse output of the clock division counter module for each phase may e an input of a sampling module 122A-J for that phase. The sampling module can generate a short periodic pulse sh_pulse(i) 194A-J from the respective long periodic pulse lg_pulse(i), where i is a positive integer in the set 1 to ph(i ∈{1, ..., ph−1, ph}). The short periodic pulse may be tuned by a tunable delay module 130I-J generating a tuned short periodic pulse tuned_sh_pulse(i) 196A-J, where i is a positive integer in the set 1 to ph(i ∈{1, ..., ph−1, ph}). Either the short periodic pulse or the tuned short periodic pulse for each phase can be combined together by a summing module 140 to generate a fractional frequency clock signal DIVOUT 198.

The fractional frequency clock signal has a period represented by $(n\pm k/ph)*T_{LO}$, where $T_{LO}$ is a period of at least one input clock signal, ph is a number of the plurality of clock division counter modules and a number of the plurality of sampling modules and represents a number of phases, and n*ph±k is the integer division provided by within each clock division counter module where ph, n, and k are positive integers and k/ph<0.5. For example, n*ph±k can be a number of non-bypassed latches in the Johnson counter.

Figure 3B:
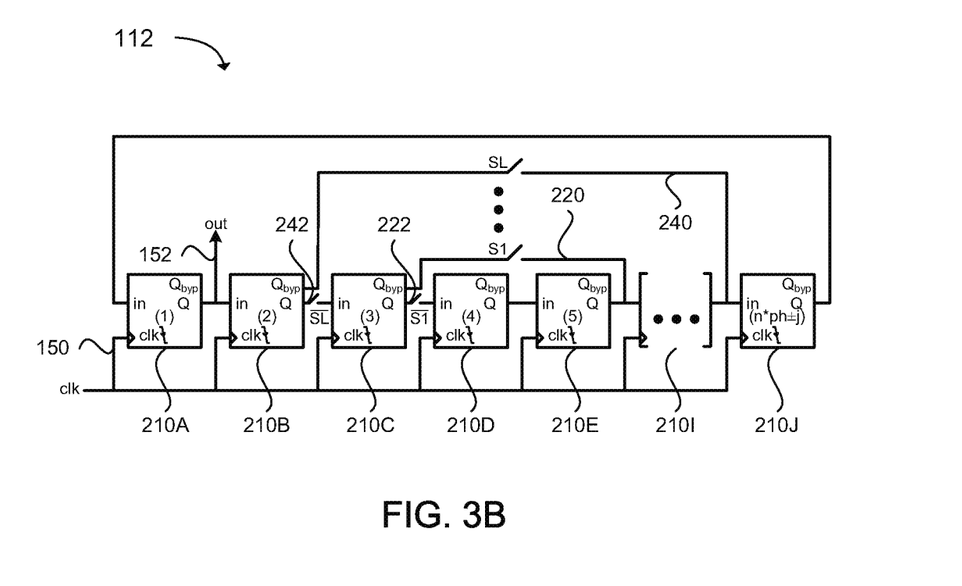
FIG. 3B illustrates a block diagram of a reconfigurable clock division counter module with n*ph±j number of latches in accordance with an example.

FIG. 3B illustrates a reconfigurable divide by n±k/ph clock division counter module 112 to obtain different integer divisions, and thereby obtain a reconfigurable fractional divider capable of dividing the input signal by different fractional numbers. The divide by n±k/ph clock division counter module can include fixed functioning latches 201A-B and 201J (always in the ring) and multiple bypass latches 201C-I, which can be configured to function in the ring or be bypassed. The divide by n±k/ph clock division counter module can have a number of switches (S1 220 [and S1 bar 222], ... SL 240 [and SL bar 242]) used to bypass latches.

Figure 4:
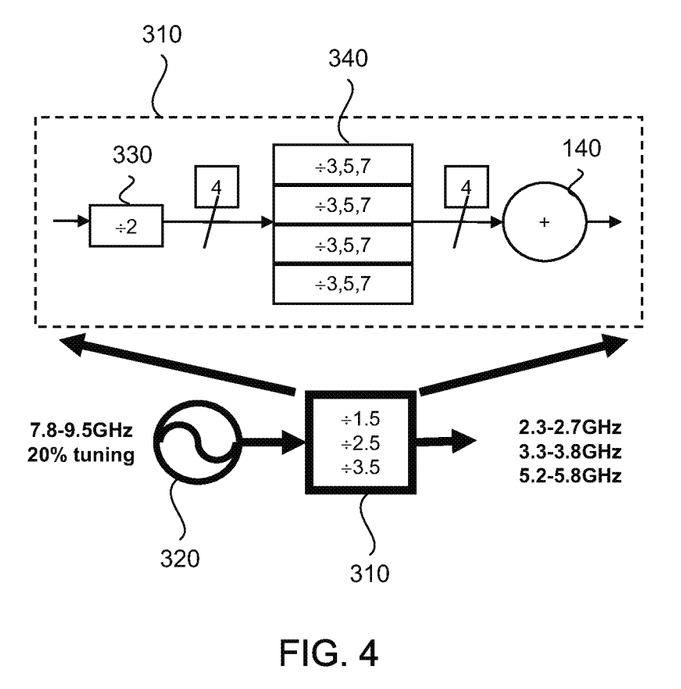
FIG. 4 illustrates a block diagram of a local oscillator with a digital fractional frequency divider in accordance with an example.

A reconfigurable digital fractional frequency divider with reconfigurable clock division counter modules can be capable of generating an LO signal for the WiFi/WiMax 2.5/3.5/5 GHz bands using a single VCO with 20% tuning range, as illustrated by FIG. 4. A digital fractional frequency divider can be fabricated with a digital CMOS process. The digital CMOS process may use a less than 50 nm digital CMOS process.

In the example of FIG. 4, a VCO 320 may have a tuning range of 7.8 GHz to 9.5 GHz (or 20%). The VCO may provide a single input signal frequency to a digital fractional frequency divider 310. The digital fractional frequency divider can include a frequency splitter 330 that can divide the frequency by two and generate 4 phases. Each phase can be coupled to a clock division counter module 340 to obtain different integer divisions, and summed by a summing module 140. The output can be configured to generate a 2.3-2.7 GHz signal, a 3.3-3.8 GHz signal, and/or a 5.2-5.8 GHz signal, which can be used in WiFi/WiMax transmission. The digital fractional frequency divider can be used to generate signals for other wireless standards as well. The digital fractional frequency divider can be used in other non-radio or non-wireless applications as well.

Figure 5:
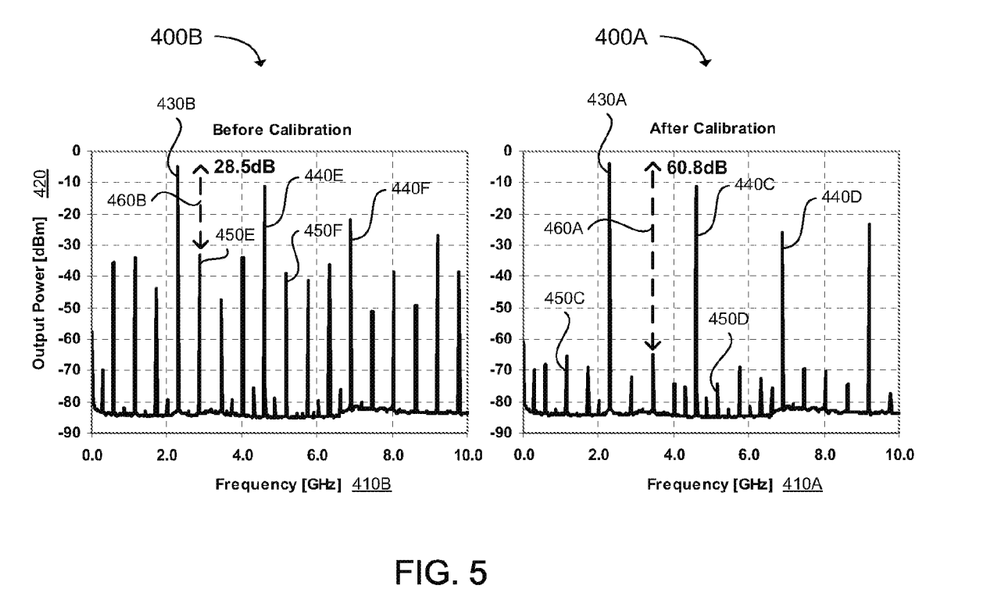
FIG. 5 illustrates a output frequency spectrum before and after calibration of a digital fractional frequency divider with tunable delay cells in accordance with an example

FIG. 5 illustrates a measured output spectrum of a digital fractional frequency divider for an 8.05 GHz input signal before calibration 400B and after calibration 400A of the tunable delay modules. The input signal is divided by 2, obtaining 4 phases, and is further divided by 1.75 using the fractional frequency divider (with the timing illustrated in FIG. 1D) for an output at 2.3 GHz 430B (before) and 430A (after). The measured output spectrum of the divider can be configured for division by 3.5(2*1.75) before calibration (400B of FIG. 5) and after calibration (400A of FIG. 5) for an output signal (or fundamental frequency) at 2.3 GHz. The x-axis represents frequency 410B (before) and 430A (after) and the y-axis represents output power 420 in dBm. The dBm (sometimes referred to as dBmW) is an abbreviation for the power ratio in decibels (dB) of the measured power referenced to one milliwatt (mW). With calibration and no analog filtering, the spurs 450E-F can be suppressed to ≤−60.8 dBc 460A.

Without calibration and no analog filtering, the spurs 450C-D may be suppressed to ≤−28.5 dBc 460B. Since a rail-to-rail output buffer may be used, harmonics 440C-F of the fundamental (at 4.6, 6.9, and 9.2 GHz) can be seen in the spectrum. The fractional frequency divider can have a minimal footprint on a silicon wafer or die and/or consume a small amount of power. For example, the fractional frequency divider fabricated using a 32 nm CMOS implementation can consumes less than 7.8 mW from a 1.05V supply and occupy less than 300 um×300 um silicon area (including a radio frequency [RF] input receiver, output buffer, and calibration circuitry). The power consumption of the fractional frequency divider can vary depending on the fabrication process used or the of the fractional frequency divider.

The digital fractional frequency divider provides for fractional division of local-oscillator (LO) signals without using mixers or expensive filters containing inductors and analog circuitry, which are used to generate LO signals with high spectral purity. Use of analog circuitry and inductors can preclude a fractional frequency divider using inductors from scaling well with process technology and can increase the die cost due to the large area occupied by inductors.

Using phase rotators is one technique used to avoid glitches in the output. A digitally controlled delay line can be used to adjust the loop delay over LO frequency and PVT variations. However, phase rotators can add to the calibration complexity, power, and area of the divider. As the LO frequency is increased, the resolution and complexity of the digitally controlled delay line may also increase. In addition, to obtain fractional division besides 1.25 and 0.75, the phase rotator may swallow pulses which can be complicated to implement with high frequency signals.

The digital fractional frequency divider can use digital logic and calibration to implement fractional division of a high-frequency signal and obtain an LO signal with acceptable spectral purity. Analog filters and inductors may not be used in the digital fractional frequency divider providing for significant silicon area savings. The absence of inductors can also make a digital fractional frequency divider topology conducive for integration in a digital system-on-chip (SoC).

The absence of MUX selection signals synchronous to the input or output signals in digital fractional frequency divider topology can greatly relax the timing requirements of the divider and makes the digital fractional frequency divider more robust to PVT variations. Using phase rotators, the timing requirements of the MUX selection signals can be stringent and the timing requirements may be synchronized to the output signal, thereby increasing the phase rotators divider's sensitivity to PVT variations and the output frequency. Calibration of the phase rotators divider's signals may be used in order to operate over a wide range of input/output frequencies and PVT variations. The speed of the digital fractional frequency divider may be affected by the switching speed of the digital logic gates and not on the digital logic gates' absolute timing accuracy. The digital fractional frequency divider may not be reliant on device model accuracy and can scale well with digital processes.

The digital fractional frequency divider provides delay corrections buffers at a fraction (determined by the ratio of the integer dividers) of the input frequency instead of the entire input frequency, as with a phase rotator divider. Thus, the power consumption of the correction buffers, which can be proportional to their frequency of operation, may be reduced by a substantially similar factor. For example, in the divide by 1.25 configuration, the signal through the correction buffers can be one-fifth of the input frequency, thereby reducing the correction buffers' power consumption by a factor of 5.

Multiple fractional division ratios can be obtained by changing the integer division ratio of the clock division counter modules based on the number of phases. Multiple fractional division ratios along with the wide operating frequency range of the digital fractional frequency divider can enhance the reusability of a design for different radio standards and LO requirements.

Figure 6:
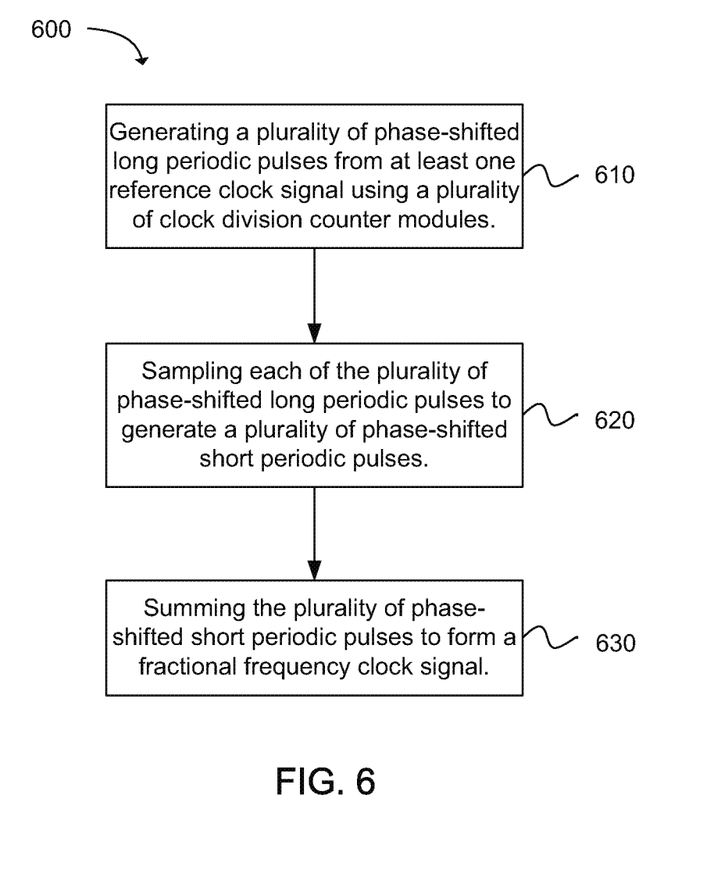
FIG. 6 depicts a flow chart of a method for fractionally dividing a digital frequency signal in accordance with an example.

Another example provides a method 600 for fractionally dividing a digital frequency signal, as shown in the flow chart in FIG. 6. The method includes the operation of generating a plurality of phase-shifted long periodic pulses from at least one reference clock signal using a plurality of clock division counter modules, as in block 610. The operation of sampling each of the plurality of phase-shifted long periodic pulses to generate a plurality of phase-shifted short periodic pulses follows, as in block 620. The next operation of the method can be summing the plurality of phase-shifted short periodic pulses to form a fractional frequency clock signal, as in block 630.

Figure 7:
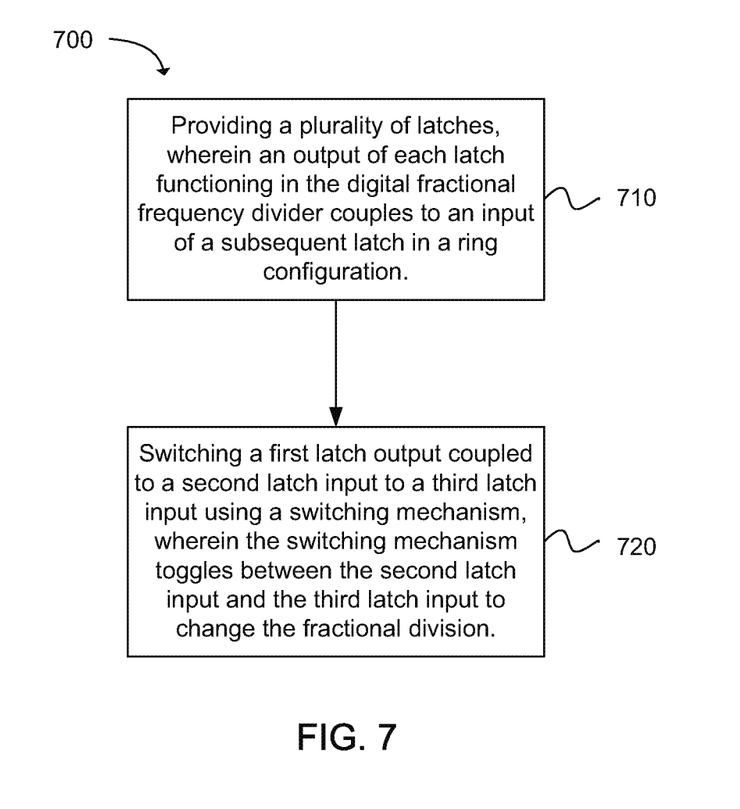
FIG. 7 depicts a flow chart of a method for selecting a fractional division in a digital fractional frequency divider in accordance with an example.

Another example provides a method 700 for selecting a fractional division in a digital fractional frequency divider, as shown in the flow chart in FIG. 7. The method includes providing a plurality of latches, wherein an output of each latch functioning in the digital fractional frequency divider couples to an input of a subsequent latch in a ring configuration, as in block 710. The operation of switching a first latch output coupled to a second latch input to a third latch input using a switching mechanism, wherein the switching mechanism toggles between the second latch input and the third latch input to change the fractional division follows, as in block 720.

Figure 8:
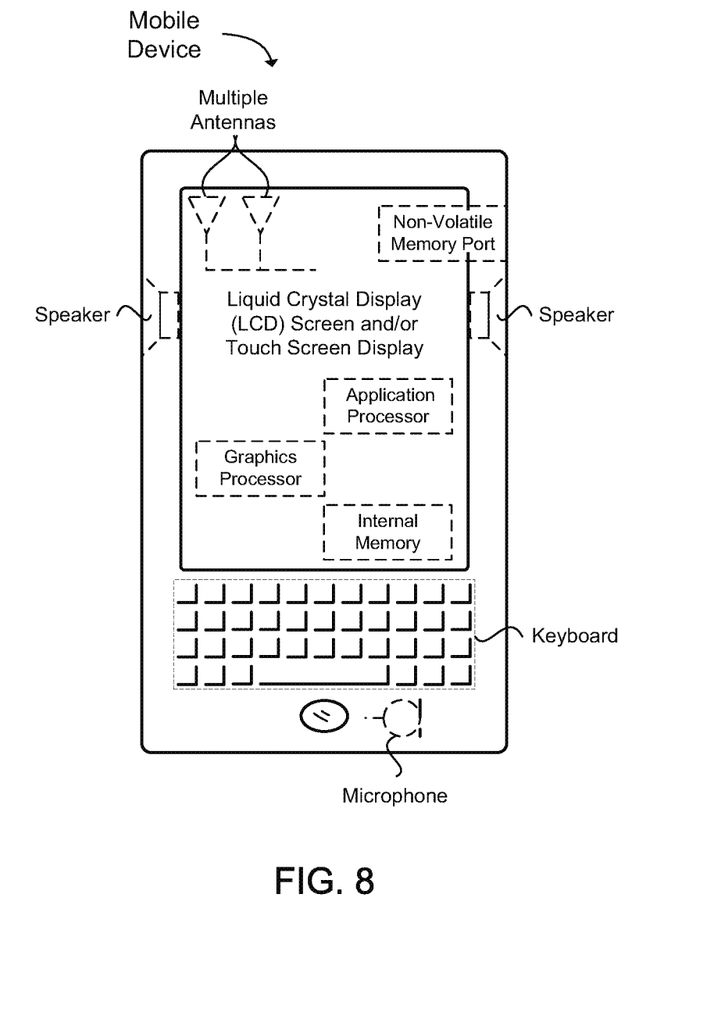
FIG. 8 illustrates a diagram of a mobile device in accordance with an example.

In another example, the digital fractional frequency divider can be included in a mobile device or a transmission station. FIG. 8 provides an example illustration of a mobile device, such as a user equipment (UE), a mobile station (MS), a mobile wireless device, a mobile communication device, a tablet, a handset, or other type of mobile wireless device. The mobile device can include one or more antennas configured to communicate with transmission station, such as a base station (BS), an evolved Node B (eNB), or other type of wireless wide area network (WWAN) access point. The mobile device can be configured to communicate using at least one wireless communication standard including third generation partnership project (3GPP) long term evolution (LTE), WiMAX (Worldwide interoperability for Microwave Access or the Institute of Electrical and Electronics Engineers (IEEE) 802.16 standard (e.g., 802.16e, 802.16m)), High Speed Packet Access (HSPA), Bluetooth, and WiFi (IEEE 802.11 standard). The mobile device can communicate using separate antennas for each wireless communication standard or shared antennas for multiple wireless communication standards. The mobile device can communicate in a wireless local area network (WLAN), a wireless personal area network (WPAN), and/or a WWAN.

FIG. 8 also provides an illustration of a microphone and one or more speakers that can be used for audio input and output from the mobile device. The display screen may be a liquid crystal display (LCD) screen, or other type of display screen such as an organic light emitting diode (OLED) display. The display screen can be configured as a touch screen. The touch screen may use capacitive, resistive, or another type of touch screen technology. An application processor and a graphics processor can be coupled to internal memory to provide processing and display capabilities. A non-volatile memory port can also be used to provide data input/output options to a user. The non-volatile memory port may also be used to expand the memory capabilities of the mobile device. A keyboard may be integrated with the mobile device or wirelessly connected to the mobile device to provide additional user input. A virtual keyboard may also be provided using the touch screen.

Various techniques, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, or other medium for storing electronic data. The base station and mobile station may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" means that a particular feature, structure, or characteristic described in connection with the example is included in at least one embodiment of the present invention. Thus, appearances of the phrases "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A digital fractional frequency divider, comprising:
   a plurality of clock division counter modules each receiving an input clock signal that is phase-shifted from a remaining plurality of input clock signals, wherein each clock division counter module generates a long periodic pulse from the received input clock signal;
   a plurality of sampling modules, wherein each sampling module couples to an output of one of the plurality of clock division counter modules and generates a short periodic pulse from the long periodic pulse;
   a summing module for summing the plurality of short periodic pulses to generate a fractional frequency clock signal; and
   at least one tunable delay module, wherein each tunable delay module couples to an output of the sampling module and aligns a phase of the short periodic pulse to a desired phase.

2. The digital fractional frequency divider of claim 1, wherein the tunable delay module includes a time-to-digital converter.

3. The digital fractional frequency divider of claim 1, wherein the plurality of short periodic pulses are non-overlapping periodic pulses with each other.

4. The digital fractional frequency divider of claim 1, further comprising a phase generation module to generate from a single clock signal a plurality of input clock signals phase-shifted from each other.

5. The digital fractional frequency divider of claim 4, wherein the phase generation module is selected from the group consisting of a voltage-controlled oscillator (VCO), a local oscillator (LO), a delay-locked loop (DLL), a phase-locked loop (PLL), a quadrature VCO, a frequency divider, and combinations thereof.

6. The digital fractional frequency divider of claim 4, wherein the fractional frequency clock signal has a period represented by $(n \pm k/ph)*T_o$, where $T_o$ is a period of at least one input clock signal, ph is a number of the plurality of clock division counter modules and a number of the plurality of sampling modules and represents a number of phases, and $n*ph \pm k$ is the integer frequency division of the counter module where ph, n, and k are positive integers and k I ph <0.5.

7. The digital fractional frequency divider of claim 1, wherein the clock division counter module is selected from the group consisting of a Johnson counter, a twisted ring counter, a straight ring counter, an Overbeck counter, a shift register, and combinations thereof.

8. The digital fractional frequency divider of claim 1, wherein the clock division counter module is reconfigurable and includes a plurality of latches and an output of each latch functioning in the clock division counter module couples to an input of a subsequent latch in a ring configuration, and the clock division counter module includes at least one switching mechanism for allowing a first latch output to switch between a second latch input and a third latch input.

9. The digital fractional frequency divider of claim 8, wherein the digital fractional frequency divider is configured to generate a clock frequency within a band of an Institute of Electrical and Electronics Engineers (IEEE) 802.11 standard, IEEE 802.16 standard, and third generation partnership project (3 GPP) long term evolution (LTE) standard.

10. The digital fractional frequency divider of claim 1, wherein the digital fractional frequency divider is included in a mobile device configured to connect to at least one of a wireless local area network (WLAN), a wireless personal area network (WPAN), and a wireless wide area network (WWAN), wherein the mobile device includes an antenna, a touch sensitive display screen, a speaker, a microphone, a graphics processor, an application processor, internal memory, a non-volatile memory port, or combinations thereof.

11. A method for fractionally dividing a digital frequency signal, comprising:
   generating a plurality of phase-shifted periodic pulses from at least one reference clock signal using a plurality of clock division counter modules,
   wherein the plurality of clock division counter modules generates a plurality of phase-shifted long periodic pulses, and further comprising sampling each of the plurality of phase-shifted long periodic pulses to generate a plurality of phase-shifted short periodic pulses before summing the plurality of phase-shifted short periodic pulses to form a fractional frequency clock signal;
   tuning at least one of the plurality of phase-shifted short periodic pulses using at least one tunable delay module; and
   summing the plurality of phase-shifted periodic pulses to form a fractional frequency clock signal.

12. The method of claim 11, wherein sampling each of the plurality of phase-shifted long periodic pulses to generate a plurality of phase-shifted short periodic pulses uses a plurality of sampling modules, and summing the plurality of phase-shifted short periodic pulses to form a fractional frequency clock signal uses a summing module.

13. The method of claim 11, further comprising adjusting a period of the plurality of phase-shifted long periodic pulses using a plurality of reconfigurable clock division counter modules, wherein the reconfigurable clock division counter module includes a plurality of latches and an output of each latch functioning in the clock division counter module couples to an input of a subsequent latch in a ring configuration, and the clock division counter module includes at least one switching mechanism for allowing a first latch output to switch between a second latch input and a third latch input.

14. A digital fractional frequency divider, comprising:
   a plurality of clock division counter modules each receiving an input clock signal that is phase-shifted from a remaining plurality of input clock signals, wherein each clock division counter module generates a periodic pulse from the received input clock signal;
   at least one tunable delay module, wherein each tunable delay module couples to an output of the clock division counter module and delay matches a phase of the periodic pulse to a desired phase; and
   a summing module for summing the plurality of periodic pulses to generate a fractional frequency clock signal.

15. The digital fractional frequency divider of claim 14, wherein the plurality of periodic pulses are non-overlapping periodic pulses with each other.

16. The digital fractional frequency divider of claim 14, wherein the clock division counter module is reconfigurable and includes a plurality of latches and an output of each latch functioning in the clock division counter module couples to an input of a subsequent latch in a ring configuration, and the clock division counter module includes at least one switching mechanism for allowing a first latch output to switch between a second latch input and a third latch input.

\* \* \* \* \*